United States Patent [19]
Vetter et al.

[11] Patent Number: 5,539,320
[45] Date of Patent: Jul. 23, 1996

[54] METHOD FOR DETERMINING THE CURRENT FLOWING THROUGH A LOAD IN A MOTOR VEHICLE

[75] Inventors: Hermann Vetter, Hessigheim; Hubert Schweiggart, Stuttgart, both of Germany

[73] Assignee: Robert Bosch GmbH, Stuttgart, Germany

[21] Appl. No.: 341,220

[22] Filed: Dec. 5, 1994

[30] Foreign Application Priority Data

Dec. 4, 1993 [DE] Germany ............... 43 41 425.7

[51] Int. Cl.$^6$ .............. G01R 35/00; G01R 31/00
[52] U.S. Cl. ............... 324/601; 324/503; 324/537; 307/10.1
[58] Field of Search .................. 324/73.1, 111, 324/123 R, 123 C, 130, 503, 537, 601; 330/2, 258, 260; 340/438, 439; 307/10.1

[56] References Cited

U.S. PATENT DOCUMENTS

| | | | |
|---|---|---|---|
| 3,581,198 | 5/1971 | Shoemaker | 324/73.1 |
| 4,354,155 | 10/1982 | Speidel et al. | 324/133 |
| 5,132,609 | 7/1992 | Nguyen | 324/130 |
| 5,337,013 | 8/1994 | Langer et al. | 324/537 |
| 5,424,677 | 6/1995 | Carson | 324/123 R |

*Primary Examiner*—Kenneth A. Wieder
*Assistant Examiner*—Glenn W. Brown
*Attorney, Agent, or Firm*—Walter Ottesen

[57] ABSTRACT

A method of determining a measurement value (U_M) utilizes a calibrating operation and a measuring operation together with an operational amplifier (OP) having an output voltage (U_A). The measurement value (U_M) represents a current (I) flowing through a load (L) in a motor vehicle having a battery. The battery has a terminal of high potential and a terminal of low potential with the difference between the potentials being the battery voltage (U_BATT). The load (L) is connected into a load current circuit and a measuring resistor (R_M) also is connected into the load current circuit conducting a load current (I) which, in turn, causes a voltage (R_M•I) to drop across the measuring resistor (R_M). The method includes the steps of: amplifying the voltage R_M•I across the measuring resistor (R_M) utilizing the operational amplifier (OP); performing the calibrating operation with a sequence of substeps; and, performing the measuring operation with a further sequence of substeps to obtain the measurement value (U_M). In this way, the previously required balancing of resistors in the calibrating operation can be omitted.

5 Claims, 2 Drawing Sheets

$$U\_A = G \cdot R\_M \cdot I + [\pm] \Delta R\_CM \cdot U\_BATT + \underbrace{[\pm] U\_OFF + U\_BIAS}_{U\_KORR\_B}$$

$$= U\_M + [\pm] \underbrace{\phantom{XXXXXXXX}}_{U\_KORR}$$

METHOD FOR DETERMINING THE CURRENT FLOWING THROUGH A LOAD IN A MOTOR VEHICLE

FIELD OF THE INVENTION

The invention relates to a method for determining a measured value representing the current flowing through a load in a motor vehicle.

BACKGROUND OF THE INVENTION

As a rule, the intensity of the current flowing through a load in a motor vehicle is determined in that the voltage, which drops across a measurement resistor disposed in the load current circuit, is amplified and the current is computed with the aid of the known amplification and the known resistance value. The amplified voltage measurement value is, however, corrected in advance of this computation. The reason for this is explained based on a known evaluation circuit as it is shown in FIG. 4 of the drawings to which reference will be made below.

The evaluation circuit 10 shown in FIG. 4 includes two load outputs LA1 and LA2 across which a load L is connected. The evaluation circuit 10 also includes two signal inputs SE1 and SE2 and two signal outputs SA1 and SA2. In addition, a terminal for the battery voltage U_BATT and a terminal for the reference potential BP are shown. Additional terminals such as those for the voltage supply of active components in the evaluation circuit 10 are not shown because they are not of significance for the following explanation.

The load current circuit extends from the terminal for the battery voltage U_BATT via a switch, a measuring resistor R_M (having a resistance value R_M), the load terminal LA1, the load L, the load terminal LA2, a driver transistor T to the reference potential. The driver transistor T is driven via a drive circuit 11 which receives its drive signal from the signal input SE2. The switch S is opened and closed with the aid of a drive signal which is applied to the signal input SE1.

The voltage at the measuring resistor R_M is supplied to an operational amplifier OP having an output which is connected to the signal output terminal SA2. The voltage at the connecting point between the switch S and the measuring resistor R_M is connected to the other signal output SA1. The potential of the operational amplifier OP is adjustable via a bias voltage source U_BIAS (having the voltage U_BIAS). The operational amplifier has the amplification G. The following equation applies to the voltage between the reference potential and the output SA2 of the operational amplifier:

$$\begin{aligned}U\_A &= G \cdot R\_M \cdot I + (\pm)\Delta R\_CM \cdot U\_BATT + \\ &\quad (1+G) \cdot (\pm)U\_OFF + U\_BIAS \\ &= G \cdot R\_M \cdot I + U\_KORR \\ &= U\_M + U\_KORR\end{aligned}$$

In this equation, the value $\Delta R\_CM \cdot U\_BATT$ represents a voltage error which originates because of inadequate common-mode balancing of the operational amplifier. The inadequate common-mode balancing is dependent upon temperature and deterioration.

To calibrate the circuit of FIG. 4, it is conventional to apply a signal having a pregiven shape to the operational amplifier OP and to trim at least one resistor in the external circuit (of the operational amplifier) so that the output signal indicates a common-mode balancing as complete as possible.

In this way, the term in the above equation (1), which is dependent upon battery voltage, has the value zero. Thereafter, the bias voltage U_BIAS is so adjusted that a positive but yet low output voltage of the operational amplifier is adjusted notwithstanding the offset voltage and even for a possibly occurring voltage, which is dependent upon temperature and deterioration, based on inadequate common-mode balancing at zero current and at very low currents. In this way, the entire swing of a downstream analog-to-digital converter can be utilized.

The common-mode balancing undertaken during the calibration operation can shift in dependence upon temperature and/or deterioration. When this occurs, it is a disadvantage of this method that the battery voltage operates with an adulterating influence on the measured value. Furthermore, at least two resistors must be trimmed, namely, one for the common-mode balancing and one for setting the bias voltage.

SUMMARY OF THE INVENTION

It is an object of the invention to provide a method for determining a measured value which represents the current flowing through a load in a motor vehicle and with which this measured value can be reliably determined even when temperature and deterioration dependent effects occur.

The method of the invention is for determining a measurement value U_M which represents current I flowing through a load in a motor vehicle having a battery. The load is connected into a load current circuit and a measuring resistor is also connected into the load current circuit. The method includes the steps of: amplifying a voltage R_M·I across the measuring resistor utilizing an operational amplifier having an output voltage U_A; repeatedly performing the following calibrating operation: applying a reference potential to the measuring resistor and detecting the output voltage U_A of the operational amplifier as a reference corrective voltage U_KORR_B; applying the battery potential to the measuring resistor; measuring the battery voltage as a calibrating battery voltage U_BATT_K and measuring the output voltage U_A as a calibrating corrective voltage U_KORR_K; and, performing the following measuring operation: measuring the output voltage U_A of the operational amplifier; measuring the battery voltage U_BATT; and, determining the measurement value U_M as:

$$U\_M = U\_A - ((U\_KORR\_K - U\_KORR\_B)/U\_BATT\_K) \cdot U\_BATT.$$

According to the invention, the dependency on battery voltage of an inadequate common-mode balancing is detected in a calibration operation. In later measuring operations, the battery voltage is detected in addition to the output voltage of the operational amplifier and, in dependence upon this battery voltage, the output voltage of the operational amplifier is corrected in order to determine the actual measurement voltage. Furthermore, no mechanical trimming of a resistor is required, but is not excluded in order to obtain a still higher accuracy.

Accordingly, the method according to the invention can also be applied in combination with the conventional method so that the first calibration is performed conventionally and then, the calibration operation according to the invention is repeatedly carried out during operation of the motor vehicle in order to compensate for the defects caused by temperature and/or deterioration.

With the method of the invention, it is, however, easily possible to omit the common-mode balancing and only undertake the less complex adjustment of the bias voltage U_BIAS. If, for example, such a current is conducted through the measurement resistor R_M that a corresponding desired voltage of 2 V is expected at the output of the operational amplifier but yet a voltage of 3.5 V occurs because of a considerable error in the common-mode balancing, the bias voltage could be coarsely set to approximately −1.5 V in order to be able to completely use the conversion range of a downstream analog-to-digital converter for the actual measurement signal. Thereafter, the calibration operation is carried out in accordance with the method of the invention in order to correct battery-voltage dependent changes because of the omitted common-mode balancing.

Finally, it is possible to omit any balancing which is preferable in order to completely save the high costs for the hardware compensation. If, in an extreme case, a voltage of −2 V caused by an omitted common-mode balancing must be expected, then the bias voltage U_BIAS is set to +2 V (in addition to the expected maximum offset voltage). Then, only the calibration method according to the invention must be carried out which is entirely based on the detection of the measured values and on the computation of the corrective values without any adjustment of resistors. In such a procedure, the complete swing of an analog-to-digital converter downstream of the operational amplifier cannot be used; however, the above-mentioned considerable cost saving is obtained.

During the calibrating operation, various measured values can be stored which are used for a later correction of the measured value representing the current. It is, however, more advantageous to compute immediately a corrective value from the calibration measured values and to only store this value for later use.

It is advantageous to, in any event, carry out the calibrating operation after switching on the ignition of the motor vehicle, either directly when switching on or delayed with respect to the switch-on time point when other basic test functions are carried out, for example, when other basic functions for operating the motor of the motor vehicle are completed. It is furthermore advantageous to undertake the calibrating operation at fixed time intervals or in such time intervals for which it is assumed that the characteristics of the operational amplifier can be so changed because of possible temperature changes that a new calibration for the particular application is desirable. When the operational amplifier is mounted, for example, in a control apparatus which is accommodated in the engine space of the motor vehicle, then it can be advantageous to carry out the calibrating operation from time to time as long as the engine is still warming up after its start.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
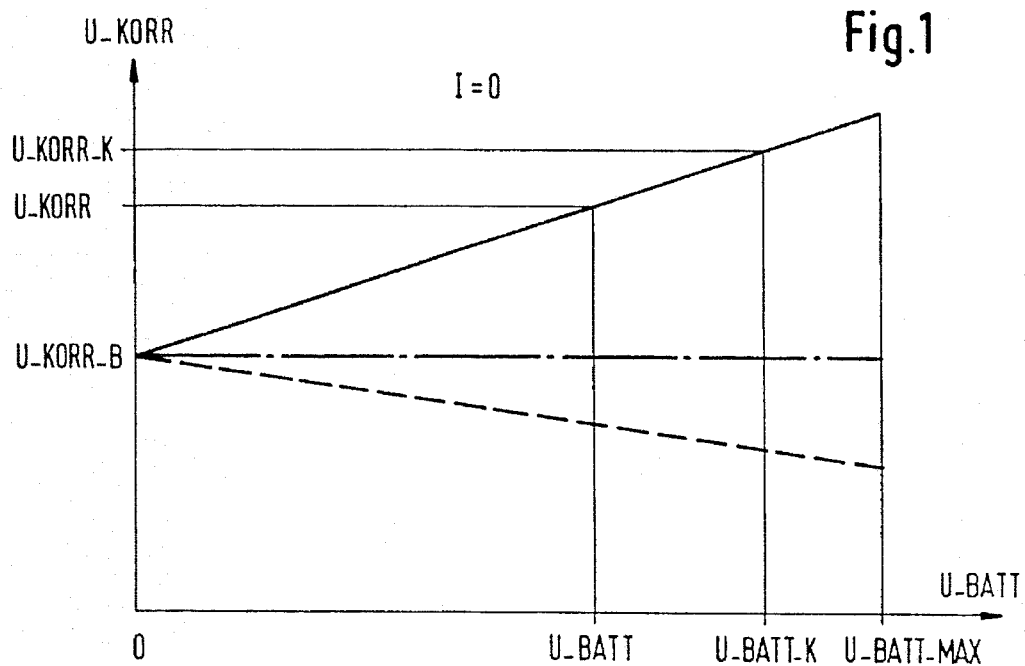
FIG. 1 is a graph for explaining the computation of a corrective value which is dependent upon the battery voltage.
Figure 4:
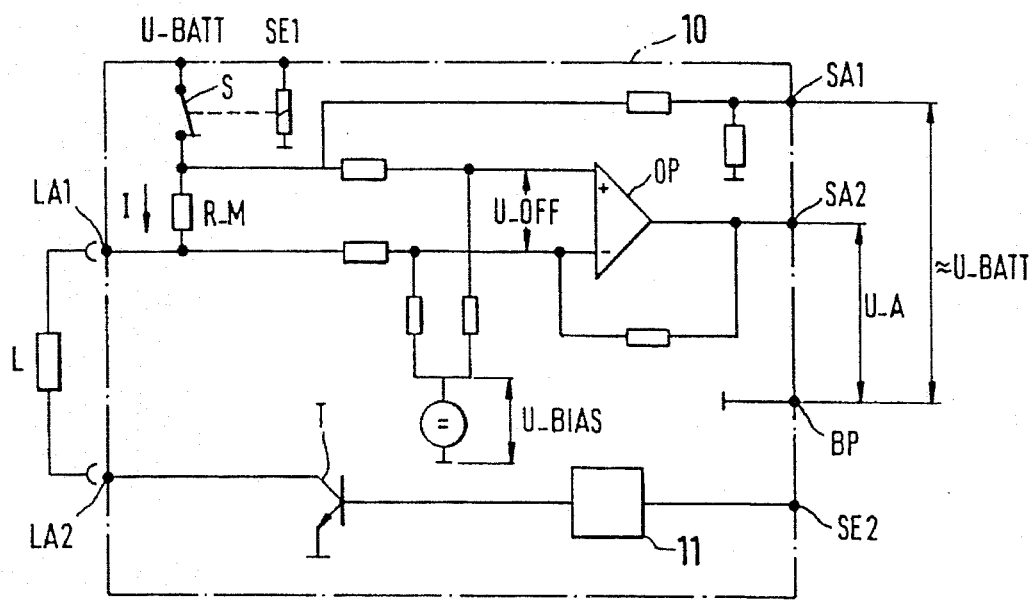
FIG. 4 shows a conventional evaluation circuit with which the method according to the invention can be carried out.

The diagram of FIG. 1 is first described with respect to equation (1) derived in connection with the explanation of FIG. 4. In this diagram, the trace of the corrective voltage U_KORR is shown dependent upon the battery voltage U_BATT. This corrective voltage is used in accordance with equation (1) to correct the output voltage U_A to obtain the measurement voltage U_M. This corrective voltage can be measured directly as the output voltage U_A of the operational amplifier when the current I to be measured is adjusted to zero because the transistor T is controlled to block (this assumes that R_M<<< all other resistors of the difference circuit).

In the equation for U_KORR, only the fixed voltages $(1+G)\cdot(\pm)U\_OFF$ and U_BIAS occur in addition to the voltage, which is dependent upon the battery voltage, because of the omitted common-mode balancing. For this reason, the dependency between U_KORR and U_BATT is given by a straight line from which the following reference corrective voltage U_KORR_B is obtained for the battery voltage zero:

$$U\_KORR\_B = (1+G)\cdot(\pm)U\_OFF + U\_BIAS \qquad (2)$$

This value can be measured in that the switch S is opened and the transistor T is driven to conduct whereby the reference voltage seen as zero is applied to the load and to the measurement resistor R_M.

A second point for the straight line for the dependency of the corrective voltage U_KORR on the battery voltage U_BATT is obtained in that the output voltage U_A of the operational amplifier is measured for the actual battery voltage U_BATT_K present during the calibrating operation (SE1 is driven, T is non-conductive). This output voltage is then identified as voltage U_KORR_K, that is, as the output voltage measured during the calibrating procedure. In this way, the following relationship is obtained:

$$\begin{aligned} U\_KORR &= U\_KORR\_B + ((U\_KORR\_K - \\ &\quad U\_KORR\_B)/U\_BATT\_K)\cdot U\_BATT \\ &= U\_KORR\_B + \Delta R\_CM \cdot U\_BATT \end{aligned} \qquad (3)$$

with $$\Delta R\_CM = (U\_KORR\_K - U\_KORR\_B)/U\_BATT\_K \qquad (4)$$

with $$\Delta R\_CM = (U\_KORR\_K - U\_KORR\_B)/U\_BATT\_K \qquad (4)$$

The solid line in FIG. 1 shows the common-mode error ratio number ΔR_CM to be positive and for the dot-dash line, the common-mode error ratio number is zero and for the broken line, it is negative. These are examples of values as they can occur in practice in the balancing circuit 10 shown in FIG. 4. However, it should be noted that the value ΔR_CM can still change with temperature and because of deterioration of the differential circuit.

Figures 2, 3:
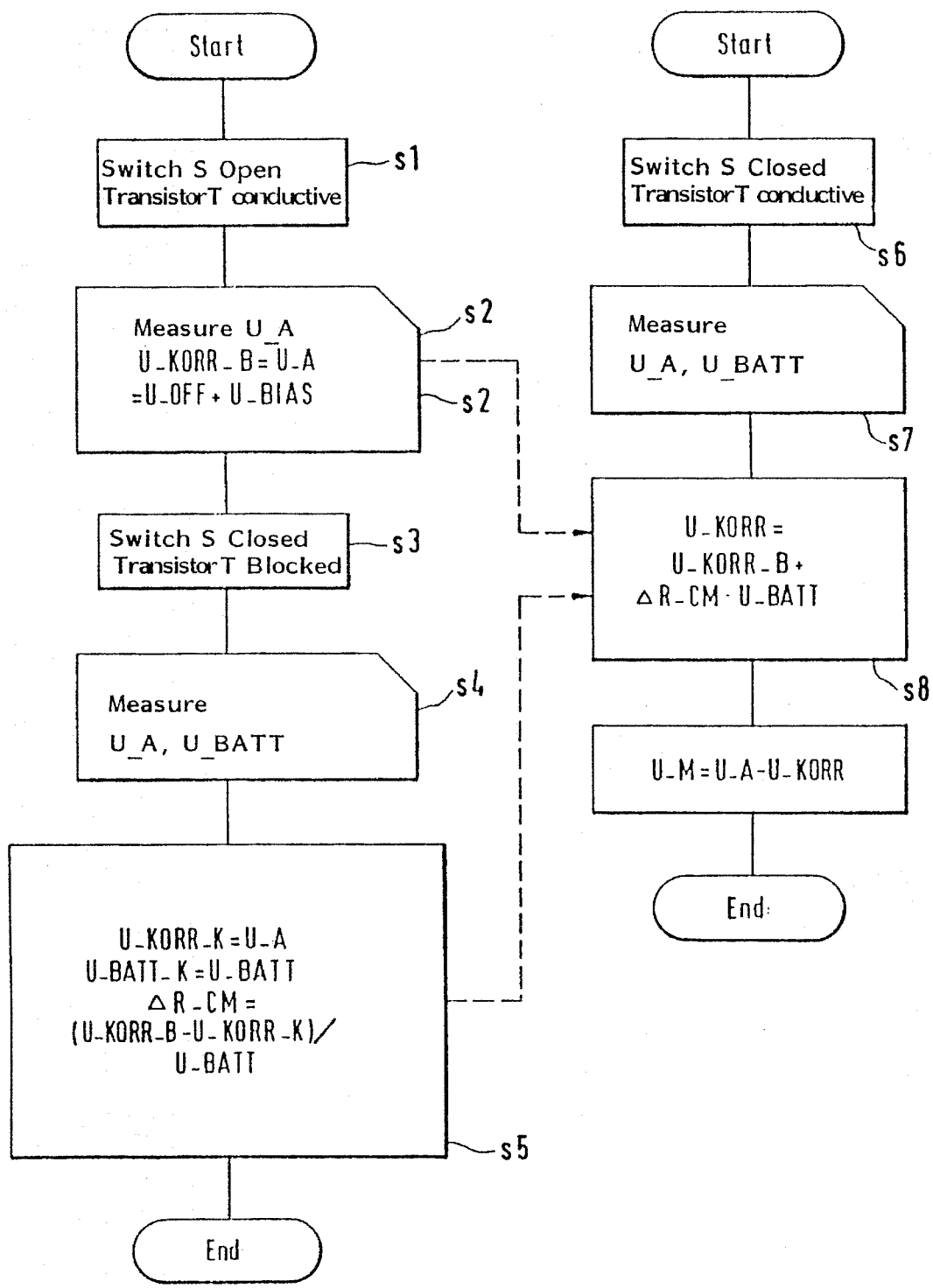
FIG. 2 is a flowchart for a calibrating operation according to the invention.
FIG. 3 is a flowchart for a measuring operation.

FIG. 2 shows the method explained with respect to FIG. 1 for determining the parameters U_KORR_B and ΔR_CM in equation (3) to determine a particular corrective voltage $U_{13}$ KORR.

According to FIG. 2, and after the start of the calibration, the switch S is opened and the transistor T is closed, that is, is made conductive (step s1) in order to detect (step s2) the reference corrective voltage U_KORR_B of equation (2) as output voltage U_A. Thereafter, the switch S is closed and the transistor is opened, that is, the transistor is blocked (step s3) whereupon the battery voltage is measured (step s4) as calibrating battery voltage U_BATT_K and the output voltage U_A of the operational amplifier as the calibrating-corrective voltage U_KORR_K. In a final step s5, in advance of the end of the calibrating method, the slope ΔR_CM of the corrective line is computed according to equation (4) from these measured values.

The output voltage U_KORR_B which is so determined and the so-determined slope ΔR_CM of the corrective straight lines are thereafter used for each detection of the measured value to determine the current flowing through the load L. For this purpose, the switch S is closed in a step s6 in accordance with FIG. 3 and the transistor T is made conductive. In step s7, the actual battery voltage U_BATT and the actual output voltage U_A of the operational amplifier OP are measured. In step s8, the corrective voltage U_KORR is computed based on the measured battery voltage U_BATT and the corrective parameters U_KORR_B and ΔR_CM. Finally, before the end of the measuring method of FIG. 3, the measured value is determined on the basis of equation (1).

As explained above, the calibration method can be configured to have a greater breadth when it is not intended to omit all balancing operations for resistors.

In the description presented above, it was assumed for the sake of simplicity that a measured value, which represents the intensity of a current flowing through a load, is measured only for a load L. In practice, an evaluation circuit similar to the evaluation circuit shown in FIG. 4 is used to drive several loads in multiplex operation. One transistor per load is then provided. This has, however, no influence on the method of the invention for determining the above-mentioned measured value.

It is understood that the foregoing description is that of the preferred embodiments of the invention and that various changes and modifications may be made thereto without departing from the spirit and scope of the invention as defined in the appended claims.

What is claimed is:

1. A method of determining a measurement value (U_M) utilizing a calibrating operation and measuring operation together with an operational amplifier (OP) having an output voltage (U_A), said measurement value (U_M) representing a current (I) flowing through a load (L) in a motor vehicle having a battery, the battery having a terminal of high potential and a terminal of low potential with the difference between said potentials being the battery voltage (U_BATT), the load (L) being connected into a load current circuit and a measuring resistor (R_M) also being connected into the load current circuit conducting a load current (I) which, in turn, causes a voltage (R_M·I) to drop across said measuring resistor (R_M), the method comprising the steps of:

amplifying said voltage R_M·I across said measuring resistor (R_M) utilizing said operational amplifier (OP);

performing the calibrating operation with the following substeps (a) to (c):
   (a) applying a reference potential to said measuring resistor (R_M) and detecting a first measurement value of said output voltage (U_A) of said operational amplifier (OP) as a reference corrective voltage U_KORR_B;
   (b) applying said high potential of said battery to said measuring resistor (R_M); and,
   (c) measuring the battery voltage as a calibrating battery voltage U_BATT_K and measuring a second measurement value of said output voltage (U_A) as a calibrating corrective voltage U_KORR_K; and, performing the measuring operation with the following substeps (d) to (f):
   (d) measuring a third measurement value of said output voltage (U_A) of said operational amplifier;
   (e) measuring the battery voltage (U_BATT); and,
   (f) determining said measurement value (U_M) from the following equation as:

$$U\_M = U\_A - ((U\_KORR\_K - U\_KORR\_B)/U\_BATT\_K) \cdot U\_BATT;$$

wherein said output voltage (U_A) in said equation corresponds to said third measurement value measured in substep (d).

2. The method of claim 1, at the end of said calibrating operation, forming a corrective factor ΔR_CM as follows:

$$\Delta R\_CM = (U\_KORR\_K - U\_KORR\_B)/U\_BATT\_K;$$

and, for the measuring operation, determining said measurement value U_M as follows:

$$U\_M = U\_A - F\_KORR \cdot U\_BATT.$$

3. The method of claim 1, wherein said calibrating operation is carried out when the ignition of the engine of the motor vehicle is switched on.

4. The method of claim 1, wherein said calibration operation is performed at such intervals of time for which it can be assumed that the characteristics of said operational amplifier and its circuitry have so changed because of changes in temperature and/or because of deterioration that a new calibration for the particular application is desired.

5. The method of claim 1, wherein, during said calibrating operation, a pregiven current is first passed through said measuring resistor (R_M) and the bias voltage U_BIAS, which shifts the potential of the entire operational amplifier, is so adjusted that the desired measurement voltage, which corresponds to the calibrating current, is set as said output voltage U_A.

* * * * *

UNITED STATES PATENT AND TRADEMARK OFFICE
CERTIFICATE OF CORRECTION

PATENT NO. : 5,539,320
DATED : July 23, 1996
INVENTOR(S) : Hermann Vetter, Hubert Schweiggart It is certified that error appears in the above-identified patent and that said Letters Patent is hereby corrected as shown below:

In column 1, line 58: insert -- (1) -- at the end of the equation.

In column 2, lines 52 and 53: delete "$U_{13}BATT.$" and substitute -- U_BATT -- therefor.

In column 4, lines 53 and 54: delete second occurrence of equation: "with $\Delta R\_CM$ = (U_KORR_K-U_KORR_B)/U_BATT_K        (4)".

In column 4, line 67: delete "$U_{13}KORR.$" and substitute -- U_KORR. -- therefor.

Signed and Sealed this

Fifteenth Day of July, 1997

*Attest:*

BRUCE LEHMAN

*Attesting Officer*        *Commissioner of Patents and Trademarks*